(12) United States Patent
Yue et al.

(10) Patent No.: US 6,191,018 B1
(45) Date of Patent: Feb. 20, 2001

(54) METHOD FOR SELECTIVE RESISTIVITY ADJUSTMENT OF POLYCIDE LINES FOR ENHANCED DESIGN FLEXIBILITY AND IMPROVED SPACE UTILIZATION IN SUB-MICRON INTEGRATED CIRCUITS

(75) Inventors: Wen-Jye Yue, I-Lan; Hsun-Chih Tsao, Taipei; Tzong-Sheng Chang, Chang-Hua, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/224,716

(22) Filed: Jan. 4, 1999

(51) Int. Cl.$^7$ ................................................ H01L 21/4763
(52) U.S. Cl. ........................ 438/592; 438/682; 438/664; 438/655; 438/651; 438/299; 438/301
(58) Field of Search ................................ 438/592, 238, 438/381–385, 649, 651, 655, 682–683, 659, 663–664, 299–301, 305–307

(56) References Cited

U.S. PATENT DOCUMENTS

| | | | |
|---|---|---|---|
| 4,640,844 | 2/1987 | Neppl et al. | 427/38 |
| 4,692,343 | 9/1987 | Price et al. | 427/38 |
| 5,355,010 | 10/1994 | Fujii et al. | 257/377 |
| 5,356,826 | * 10/1994 | Natsume | 438/238 |
| 5,397,729 | * 3/1995 | Kayanuma et al. | 438/384 |
| 5,413,957 | * 5/1995 | Byun | 438/303 |
| 5,514,617 | 5/1996 | Liu | 437/60 |
| 5,593,924 | 1/1997 | Apte et al. | 437/200 |
| 5,631,188 | * 5/1997 | Chang et al. | 438/253 |
| 5,937,325 | * 8/1999 | Ishida | 438/655 |
| 5,960,319 | * 9/1999 | Iwata et al. | 438/664 |
| 5,965,617 | * 9/1999 | Kimura et al. | 438/682 |
| 5,989,996 | * 11/1999 | Kishi | 438/621 |
| 6,030,863 | * 2/2000 | Chang et al. | 438/229 |
| 6,034,401 | * 3/2000 | Hsia et al. | 257/369 |

OTHER PUBLICATIONS

Chang et al., "ULSI Technology", The McGraw-Hill Companies, 1996, pp. 393–396.

* cited by examiner

*Primary Examiner*—Charles Bowers
*Assistant Examiner*—Thanh Nguyen
(74) *Attorney, Agent, or Firm*—George O. Saile; Stephen B. Ackerman

(57) ABSTRACT

A method for forming a polycide layer wherein the silicide layer is blanket deposited over a polysilicon layer and selectively ion implanted through a mask to form regions of a higher resistivity than the masked regions. The implanted polycide layer is then annealed by RTA and patterned to form the conductors, gate electrodes and interconnects from the low resistivity regions and resistive components of an integrated circuit from the high resistivity regions. The capability of selecting from high and low resistive regions in a single polycide layer permits the design of resistive components with smaller areas than would be permitted if the resistive components were formed of a single low resistivity layer. This extra degree of freedom permits the designer to optimize device density and device performance without compromising either. The procedure utilizes a additional masking step utilizing a block-out mask.

12 Claims, 3 Drawing Sheets

METHOD FOR SELECTIVE RESISTIVITY ADJUSTMENT OF POLYCIDE LINES FOR ENHANCED DESIGN FLEXIBILITY AND IMPROVED SPACE UTILIZATION IN SUB-MICRON INTEGRATED CIRCUITS

BACKGROUND OF THE INVENTION (1) Field of the Invention

The invention relates to processes for the manufacture of semiconductor devices and more particularly to processes for forming polycide conductive wiring and polycide gate electrodes for polysilicon gate field effect transistor integrated circuits.

(2) Background of the invention and description of prior art

Refractory metals and their silicides have found widespread use in the manufacture of very large scale integrated circuits. Tungsten silicide($WSi_2$) is frequently selectively formed over exposed silicon surfaces by depositing a tungsten layer, annealing to react the layer with the silicon areas and etching away the unreacted tungsten, leaving tungsten silicide only on the silicon. Other refractory metal silicides, for example $MoSi_2$, $TaSi_2$, $TiSi_2$, and $CoSi_2$ have also been formed over polysilicon lines, gate electrodes, and interconnects to form the composite polysilicon/silicide layers which are referred to in the art as polycide layers. The metal silicide portion of the polycide layer greatly enhances the conductivity of the polycide conductor and thereby improving device performance.

The most widely used and best understood metal suicides are $TiSi_2$ and $WSi_2$. $TiSi_2$ is generally formed by deposition of the Ti onto the polysilicon and then annealing at a temperature around 600° C. or less to form the silicide. Next, after removing unreacted Ti, a second, higher temperature, anneal is performed to convert the C49 crystalline phase of $TiSi_2$ to the higher conductivity C54 crystalline phase. Apte, et.al., U.S. Pat. No. 5,593,924 shows that amorphization of the silicon surface by ion implantation before silicide formation. A capping layer of TiN applied over the silicide prevents contamination. This is believed to increase the percentage of C49 phase which transforms to C54 phase during a subsequent anneal, thereby reducing the resistivity and improving the uniformity of the polycide.

Refractory metal suicides may also be formed by depositing the metal suicide onto a polysilicon layer prior to patterning. Chang, C. Y. and Sze, S. M., "ULSI Technology" McGraw-Hill, N.Y., (1996), p 393–4 shows several methods for forming metal silicides by reactions of refractory metal precursors with silane and dichlorosilane. Price, U.S. Pat. No. 4,692,343 cites the formation of tungsten suicide by a PECVD (plasma enhanced chemical vapor deposition) process using $WF_6$ and $SiH_2Cl_2$.

Liu, U.S. Pat. No. 5,514,617 cites ion implantation of polysilicon or polycide layers with conventional semiconductor dopants such as arsenic, boron, phosphorous, and $BF_2^+$ ions to form load resistors in poly-load SRAM(static random access memory) integrated circuits.

Fujii, et. al. in U.S. Pat. No. 5,355,010 shows a method for forming a silicide layer over a polysilicon layer which has—and p-type regions. The silicide layer is ion implanted with the p-type impurity boron, in order to have a substantially uniform concentration in the silicide layer thereby preventing out-diffusion from the polysilicon layer. Neppl, et. al., U.S. Pat. No. 4,640,844 shows ion implantation of dopants into the metal silicide layer of polycide gate electrodes. The dopants are thereafter diffused into the subjacent polysilicon.

Generally, the resistivity of the polycide layers is controlled by the deposition parameters and a high temperature annealing step. Blanket ion implantation has been applied to amorphise the polysilicon prior to forming the silicide layer. Amorphization of the polysilicon facilitates the transition of the higher resistivity C49 crystalline phase of the silicide to the lower resistivity C54 phase. Resistivity modification of polysilicon is made possible by incorporation of semiconductive dopant impurities, either by ion implantation or by in-situ doping during deposition, because of the semiconductive property of polysilicon. Metal suicides such as tungsten silicide do not behave as semiconductors, and are applied over polysilicon layers to lower the overall resistance of the resultant polycide layer as much as possible.

None of the known prior art seeks to controllably modify the resistivity of the metal silicide portion of the polycide layer in order to achieve a particular value of resistivity which is stable over the remainder of the chip processing. The circuit designer is thereby left with a polycide layer of a single, usually low as possible, resistivity from which to fabricate various and sundry resistive components, interconnects, gate electrodes, and long polycide wiring runs directed by the circuit design. He thus must size the all the components which are to be formed in a polycide layer of a single resistivity. Resistors formed from the polycide layer must then be made with relatively large areas if the polycide layer is to provide high conductivity for long wiring runs and interconnects. Component requiring large RC time constants must be accommodated by greater area consumption. Surface area, often referred to as "real estate" is at a premium in high density integrated circuits and must be used as efficiently as possible. It would therefore be of great advantage to design integrated circuits with more than one choice of polycide resistivity. This would add an additional degree of freedom at this level which would permit high performance as well reduced real estate usage.

It would therefore be desirable to have a means for selectively adjusting the resistivity of portions of the silicide layer wherein a higher resistivity is available to circuit designers.

SUMMARY OF THE INVENTION

It is an object of this invention to provide a method for adjusting the resistivity of suicide films to a predetermined value.

It is another object of this invention to provide a method for stabilizing the resistivity of a suicide film after adjustment so that the resistivity is not affected during subsequent processing.

It is another object of this invention to provide a method for providing a polycide layers having regions with different resisitivities whereby circuit designers may select optimal resistivities for high and low resistivity components. Such regions may be used to form integrated circuit components such as resistors, delay lines, and other resistive elements.

It is yet another object of this invention to provide a method for improving the efficiency of space utilization of high density integrated circuit components without compromising circuit performance.

These and other objects which will become apparent are accomplished by masking an integrated circuit wafer after formation of the refractory metal silicide to expose selected regions. Impurity ions are then implanted into the exposed metal silicide. The implanted ions modify the resistivity of the metal silicide in the selected regions. After implantation, the mask is removed and the wafer is subjected to a high temperature anneal which forms a low resistivity polycide in the masked regions and a higher resistivity polycide in the selected regions which received the ion implantation. The high temperature anneal, which is preferably by RTA (rapid thermal annealing) stabilizes the resistivity of the metal silicide in that subsequent exposure of the metal silicide to ion implantation does not alter it's resistivity.

DESCRIPTION OF THE PREFERRED EMBODIMENTS

In a preferred embodiment of this invention a self-aligned gate MOSFET (metal oxide semiconductor field effect transistor) and a resistor are formed on a silicon wafer. A polycide layer is formed having a first region of high resistivity and a second region of low resistivity. The MOSFET is provided with a polycide gate electrode formed from the low resistance region of a polycide layer and the resistor is formed from the high resistance region of the same polycide layer. The gate electrode and the resistor are shown as examples of high and low resistivity integrated circuit components formed from the same polycide layer. It is to be understood that other low resistive components such as local and global interconnects can also be formed from the same polycide layer as other high resistivity components such as resistors, delay line elements, and the like.

Figure 1A:
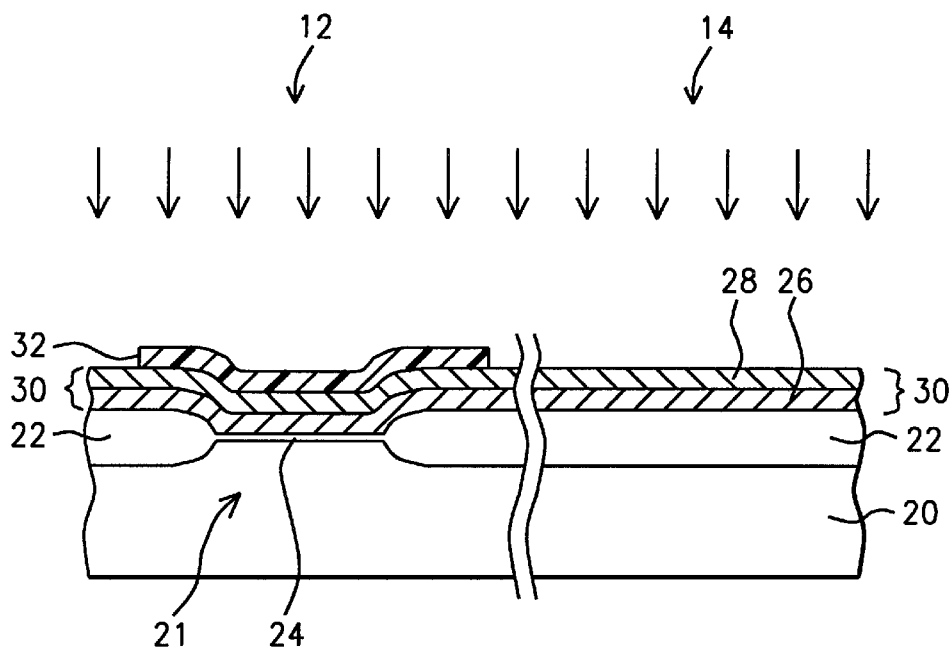
FIG. 1A through FIG. 1E are cross sectional views of an in-process silicon wafer showing the process steps for forming a polycide layer according to the process of this invention.

A monocrystalline silicon wafer is provided. Referring to FIG. 1A there is shown a cross section of the silicon wafer 20 in which an n-channel self-aligned polycide gate MOSFET is to be been formed in a first region 12. A field oxide region (FOX) 22 is formed by the well known method of local oxidation of silicon (LOCOS) to define an active silicon region 21 wherein the MOSFET device is to be formed. A gate oxide 24 is next grown over the active region 21 by thermal oxidation. In a second region 14 of the wafer 20, a polycide resistor is to be formed over field oxide 22.

A polysilicon layer 26 is deposited on the wafer 20 by conventional well known methods, typically by LPCVD (low pressure chemical vapor deposition). The polysilicon layer may be in-situ doped with an n-type impurity, for example phosphorous or arsenic, or the impurity may be ion implanted into the layer 26 after the layer is deposited. Alternately, the polysilicon layer 26 may be a composite of a lower un-doped layer and upper doped layer. The polysilicon layer is between about 1,200 and 1,800 Angstroms in thickness.

A layer of $WSi_x$ 28 is next deposited over the polysilicon layer 26 by LPCVD and the reduction of $WF_6$ with dichlorosilane forming the composite polycide layer 30. The deposition is carried out at a temperature between about 500 and 600° C. Alternative methods, such as the silane reduction of $WF_6$ may also be used to deposit the $WSi_x$ layer 28. These procedures are well known in the art. The $WSi_x$ layer is deposited to a thickness of between about 1,000 and 1,500 Angstroms.

A mask 32, preferably photoresist, is next patterned on the polycide layer 30 using conventional photolithographic techniques. The mask 32 is patterned to expose those regions which are to be ion implanted and thereby become regions of high resistivity $WSi_x$. For most applications the mask 32 need not be of a type requiring critical alignment. Such a mask is typically referred to as a block-out mask. Although critical alignment is not generally required, nevertheless, the block out mask 32 is capable to define selected regions sufficiently localized, that individual high resistive components need not be grouped, but may be placed by the designer, at their most advantageous locations with regard to circuit layout and performance.

Arsenic ions are next implanted into the $WSi_x$ layer 28 at a dose of between about $1 \times 10^{13}$ and $1 \times 10^{15}$ ion/cm$^2$ and at an energy of between about 40 and 60 keV. This places the centroid of the dose within the $WSi_x$ layer 28. The arsenic ions amorphisize the $WSi_x$ layer and subsequently act as an impurity which determines the degree of crystalline phase transformation which occurs during in a subsequent resistivity stabilization anneal. It is postulated that $WSi_x$ does not behave as a semiconductor and therefore the arsenic implanted into the $WSi_x$ does not behave as semiconductive impurity dopant but rather causes disruption and modification of the $WSi_x$ structure which determines the degree of crystal phase transformation which is brought about by the stabilization anneal. Alternately other ions, for example, phosphorous, boron, $BF_2^+$, silicon, antimony, and germanium may be implanted into the $WSi_x$ layer 28 at comparable doses and at energies which will confine the implant within the $WSi_x$ layer 28. Arsenic is preferred because it is a heavy ion and is commonly used in semiconductor manufacturing. After the implantation the photoresist mask 32 is stripped using well known methods, for example, by plasma ashing or with liquid strippers.

The wafer 20 is next subjected to a rapid thermal anneal at a temperature between about 800 and 900° C. in a nitrogen ambient for a period of between about 20 and 60 seconds. During this period the crystalline structure and the resistivity of the $WSi_x$ layer 28 is stabilized.

Figure 1B:
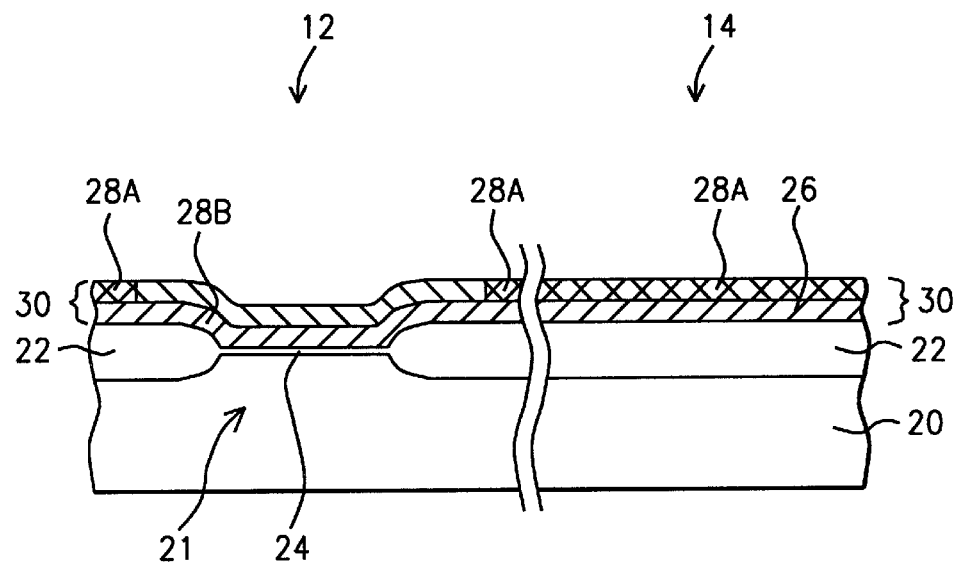

FIG. 1B shows a cross section of the region 12 where the MOSFET is to be formed and the region 14 region for the resistor, after the RTA. The implanted high resistivity $WSi_x$ 28A is now denoted by a cross hatch to distinguish it from the un-implanted $WSi_x$ 28B.

Figure 1C:
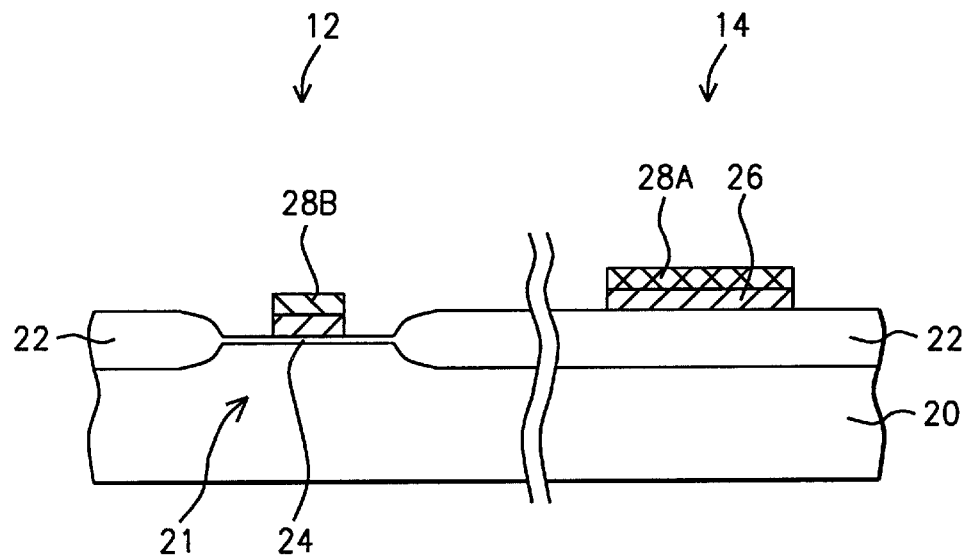

Referring now to FIG. 1C, the annealed polycide layer 30 is patterned by conventional methods, preferably by photoresist and RIE(reactive ion etching) to form various conductive elements of the integrated circuit. In the present embodiment a low resistivity gate electrode 32 of the n-channel MOSFET 16 is formed of the polycide with the un-implanted $WSi_x$ 28B in the first region 12. A resistor 18 is formed of the polycide layer with the high resistivity $WSi_x$ 28A in the second region 14.

Figure 1D:
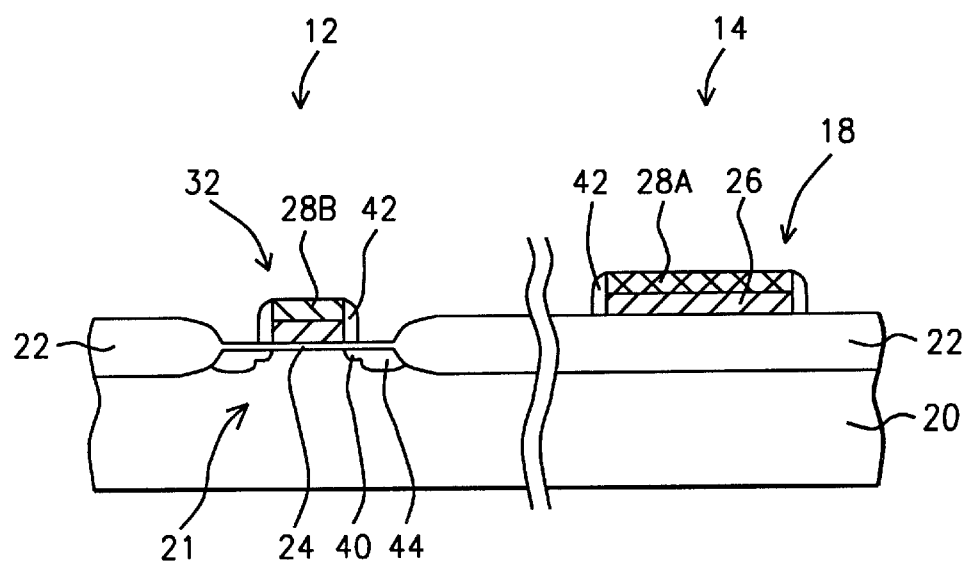

After patterning, n-type ions, for example arsenic, are ion implanted into the wafer 20 according to methods well known in the art to form the n-type LDD regions 40. Please refer now to FIG. 1D. Next sidewalls 42 are formed by first depositing a blanket conformal layer of an insulator, for example silicon oxide, and then anisotropically etching back to the silicon surface, leaving the sidewall structures 42. This procedure is well established and is widely used in the art. Finally, source/drain regions 44 are ion implanted, again using an n-type impurity ion such as arsenic with the sidewall 42 acting as a mask, thereby extending the source/drain further away from the gate region than the LDD regions 40. Dosages and energies used to form LDD and source/drain regions are well known in the art. Although the $WSi_x$ layers 28A, 28B are directly exposed to both the LDD and the source/drain ion implantations, the sheet resistance of the polycide layers remains unchanged.

Figure 1E:
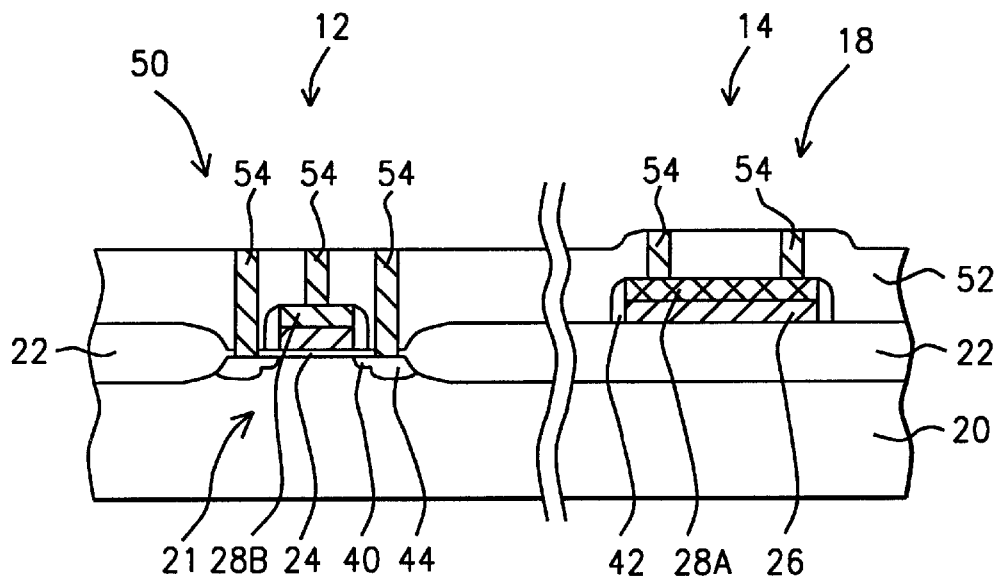

Referring now to FIG. 1E, an interlevel dielectric layer 50 is formed over the wafer by methods well known in the art. Contacts 54 to the elements of the MOSFET 50 in region 12 and the resistor 18 in region 14 are then formed using conventional methods.

Figure 2:
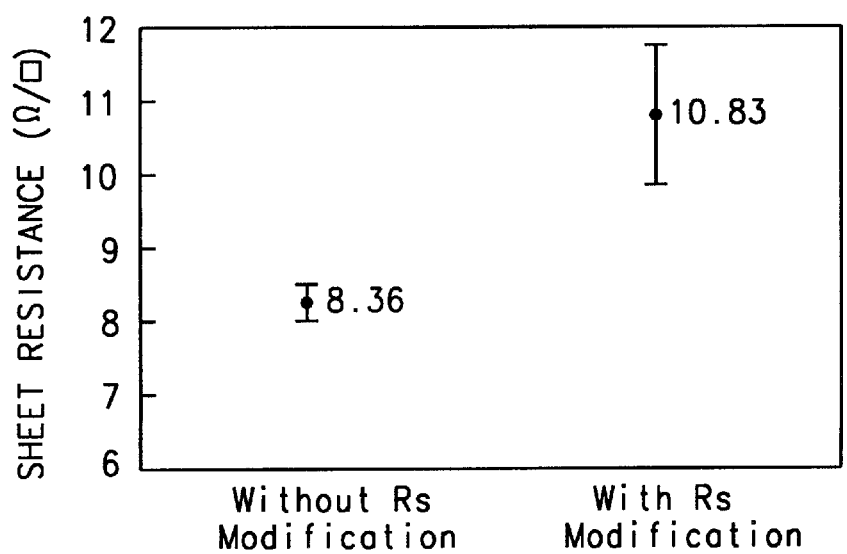
FIG. 2 is a chart showing the effect of ion implantation on the resistivity of a $WSi_x$ layer.

Experiments were performed to characterize the effect of ion implantation and anneal on the sheet resistance of a $WSi_x$ polycide layer. The results of such an experiment are shown in FIG. 2 where the sheet resistance $R_s$ of an arsenic implanted $WSi_x$ layer was compared with an un-implanted $WSi_x$ control. The ion implant was performed with an arsenic dose of $6\times10^{13}$ ions/cm$^2$ and an energy of 60 keV. Both the implanted sample and the control were subjected to a 800° C. RTA. The sheet resistance of each layer was measured using conventional measurement procedures. The results show a 30% higher sheet resistance of the arsenic implanted layer. Subjecting the $WSi_x$ layers of the experiment to typical subsequent process ion implantations such as LDD or source/drain implantations showed no change in the values of sheet resistance.

While the invention has been particularly shown and described with reference to the preferred embodiments thereof, it will be understood by those skilled in the art that various changes in form and details may be made without departing from the spirit and scope of the invention.

Whereas the embodiments of the invention use a p-type silicon wafer to form an n-channel MOSFET, it is intended that an n-type wafer may also be used to form a p-channel MOSFET without departing from the spirit of the invention. It is further intended that the resistivity of the substrate wafer as used in the invention implies the resistivity of the base into which the MOSFET is formed.

A single ion implantation has been described in the embodiments. It follows from the main idea of the invention that more than one ion implantations may be performed using more than one masking pattern to form more than two different resistivity regions. Whereas, the embodiment shows the formation of a simple resistor, it is apparent that the process of the invention may also be employed to form other types of resistive elements of an integrated circuit.

What is claimed is:

1. A method of forming a polycide layer having a region of a first resistivity and a region of a second resistivity comprising:
   (a) providing a silicon wafer;
   (b) forming an insulative layer over said silicon wafer;
   (c) forming a polysilicon layer of said first resistivity over said insulative layer;
   (d) forming a refractory metal silicide layer on said polysilicon layer;
   (e) forming a mask on said silicide layer exposing a portion of said suicide layer;
   (f) implanting ions into said portion, thereby forming a region of said second resistivity;
   (g) removing said mask;
   (h) subjecting said substrate wafer to a rapid thermal anneal; and
   (i) patterning said polycide layer to form a first plurality of islands of said first resistivity and a second plurality of islands of said second resistivity wherein said first resistivity is higher than said second resistivity and said first plurality of islands are patterned to form resistive elements and said second plurality are patterned to form interconnective elements.

2. The method of claim 1 wherein said refractory metal silicide layer is tungsten silicide.

3. The method of claim 1 wherein said ions are selected from the group consisting of arsenic, phosphorous, boron, $BF_2^+$, silicon, antimony, and germanium.

4. The method of claim 1 wherein said refractory metal silicide layer is between about 1,000 and 1,500 Angstroms thick.

5. The method of claim 1 wherein said ions are arsenic ions implanted at a dose of between about $1\times10^{13}$ and $1\times10^{15}$ ions/cm$^2$ at an energy of between about 40 and 60 keV.

6. The method of claim 1 wherein said rapid thermal anneal is at a temperature of between about 800 and 900° C. in a nitrogen ambient for a period of between about 20 and 60 seconds.

7. A method of forming a self aligned polycide gate MOSFET and a polycide resistor comprising;
   (a) providing a silicon wafer;
   (b) forming a field oxide on said silicon wafer wherein said field oxide is patterned to define a silicon active area;
   (c) forming a gate oxide on said active area;
   (d) forming a polysilicon layer on said gate oxide;
   (e) forming a polycide layer by depositing a refractory metal silicide layer on said polysilicon layer;
   (f) forming a mask on said polycide layer exposing a first region of said polycide layer and covering a second region of said polycide layer, said second region including a portion of said polycide layer over said active region which is to become a gate electrode;
   (g) implanting ions into said metal silicide layer in said first region;
   (h) removing said mask;
   (i) subjecting said substrate wafer to a rapid thermal anneal;
   (j) patterning said polycide to form a polycide resistor in said first region and a gate electrode in said second region; and
   (k) forming source/drain elements adjacent to said gate electrode thereby forming a self-aligned polycide gate MOSFET.

8. The method of claim 7 wherein said refractory metal silicide layer is tungsten silicide.

9. The method of claim 7 wherein said ions are selected from the group consisting of arsenic, phosphorous, boron, $BF_2^+$, silicon, antimony, and germanium.

10. The method of claim 7 wherein said refractory metal silicide layer is between about 1,000 and 1,500 Angstroms thick.

11. The method of claim 7 wherein said ions are arsenic ions implanted at a dose of between about $1\times10^{13}$ and $1\times10^{15}$ ions/cm$^2$ at an energy of between about 40 and 60 keV.

12. The method of claim 7 wherein said rapid thermal anneal is at a temperature of between about 800 and 900° C. in a nitrogen ambient for a period of between about 20 and 60 seconds.

* * * * *